United States Patent
Wang et al.

(10) Patent No.: US 6,770,976 B2
(45) Date of Patent: Aug. 3, 2004

(54) PROCESS FOR MANUFACTURING COPPER FOIL ON A METAL CARRIER SUBSTRATE

(75) Inventors: Jiangtao Wang, Cleveland Heights, OH (US); Dan Lillie, Garfield Heights, OH (US); David B. Russell, Cleveland, OH (US); Sidney J. Clouser, Chardon, OH (US)

(73) Assignee: Nikko Materials USA, Inc., Chandler, AZ (US)

( * ) Notice: Subject to any disclaimer, the term of this patent is extended or adjusted under 35 U.S.C. 154(b) by 0 days.

(21) Appl. No.: 10/074,988

(22) Filed: Feb. 13, 2002

(65) Prior Publication Data

US 2003/0153169 A1 Aug. 14, 2003

(51) Int. Cl.$^7$ ............................................... H01L 23/48
(52) U.S. Cl. ........................ 257/759; 257/664; 257/678; 257/798; 257/750; 257/758; 257/760
(58) Field of Search ................................. 257/251, 664, 257/678, 784, 798, 750, 758, 759, 760; 438/687, 624; 428/626, 606, 615, 624

(56) References Cited

U.S. PATENT DOCUMENTS

| | | | |
|---|---|---|---|
| 3,969,199 A | 7/1976 | Berdan et al. | 204/33 |
| 3,984,598 A | 10/1976 | Sarazin et al. | 428/336 |
| 3,998,601 A | 12/1976 | Yates et al. | 29/195 |
| 4,088,544 A | 5/1978 | Hutkin | 204/12 |
| 4,293,617 A | 10/1981 | Nagy | 428/469 |
| 4,351,697 A | 9/1982 | Shanefield et al. | 156/643 |
| 4,503,112 A | 3/1985 | Konicek | 428/216 |
| 4,521,280 A | 6/1985 | Bahrle et al. | 204/15 |
| 4,540,464 A | 9/1985 | Mueller et al. | 156/639 |
| 4,597,828 A | 7/1986 | Tadros | 156/643 |
| 4,622,106 A | 11/1986 | Kitagawa | 204/15 |
| 4,737,446 A | 4/1988 | Cohen et al. | 430/311 |
| 4,790,912 A | 12/1988 | Holtzman et al. | 204/15 |
| 4,961,828 A | 10/1990 | Lin et al. | 204/27 |
| 5,114,543 A | 5/1992 | Kajiwara et al. | 205/152 |
| 5,167,997 A | 12/1992 | Chamberlain et al. | 428/76 |
| 5,210,590 A | 5/1993 | Landa et al. | 356/319 |
| 5,262,247 A | 11/1993 | Kajiwara et al. | 428/607 |
| 5,302,494 A | 4/1994 | Grandmont et al. | 430/325 |
| 5,322,975 A | 6/1994 | Nagy et al. | 174/257 |
| 5,354,593 A | 10/1994 | Grandmont et al. | 428/137 |
| 5,356,528 A | 10/1994 | Fukuda et al. | 205/155 |
| 5,366,814 A | 11/1994 | Yamanishi et al. | 428/607 |
| 5,456,817 A | 10/1995 | Hino et al. | 205/125 |
| 5,569,545 A | 10/1996 | Yokono et al. | 428/626 |
| 5,674,596 A | 10/1997 | Johnston | 428/209 |
| 5,725,937 A | 3/1998 | Johnston | 428/209 |
| 5,773,132 A | 6/1998 | Blumberg et al. | 428/209 |
| 5,897,761 A | 4/1999 | Tagusari et al. | 205/77 |

(List continued on next page.)

FOREIGN PATENT DOCUMENTS

EP          0872301          10/1998          ........... B23K/20/10

OTHER PUBLICATIONS

U.S. patent application Publication No. 2001/0019780, publication date, Sep. 6, 2001, Obata et al., entitled: Metal Foil with Carrier and Method for Manufacturing the Same.
U.S. patent application Publication No. 2003/0029730, publication date, Feb. 13, 2003, Lee et al., entitled: Copper on Invar[00ab] Composite.

*Primary Examiner*—Richard Elms
*Assistant Examiner*—Douglas M Menz
(74) *Attorney, Agent, or Firm*—Kusner & Jaffe

(57) ABSTRACT

A method and apparatus for forming a relatively thin releasable layer of copper on a carrier substrate. First, a separation facilitating layer is provided on the carrier substrate. A layer of vapor-deposited copper is then formed over the separation facilitating layer to protect the separation facilitating layer during subsequent processing. Thereafter, the thickness of the copper layer is increased by the electrodeposition of copper onto the vapor-deposited layer. The copper layer is applied to a dielectric and is released from the carrier substrate at the separation facilitating layer.

29 Claims, 2 Drawing Sheets

U.S. PATENT DOCUMENTS

| | | | |
|---|---|---|---|
| 6,007,652 A | * 12/1999 | Hosokawa et al. | 156/89.16 |
| 6,117,300 A | 9/2000 | Carbin et al. | 205/125 |
| 6,132,589 A | 10/2000 | Ameen et al. | 205/177 |
| 6,248,401 B1 | 6/2001 | Chiang et al. | 427/255.7 |
| 6,270,889 B1 | 8/2001 | Kataoka et al. | 428/352 |
| 6,319,620 B1 | * 11/2001 | Kataoka et al. | 428/626 |
| 6,322,904 B1 | 11/2001 | Dobashi et al. | 428/624 |
| 6,346,335 B1 | 2/2002 | Chen et al. | 428/629 |
| 6,492,268 B1 | * 12/2002 | Pyo | 438/687 |

\* cited by examiner

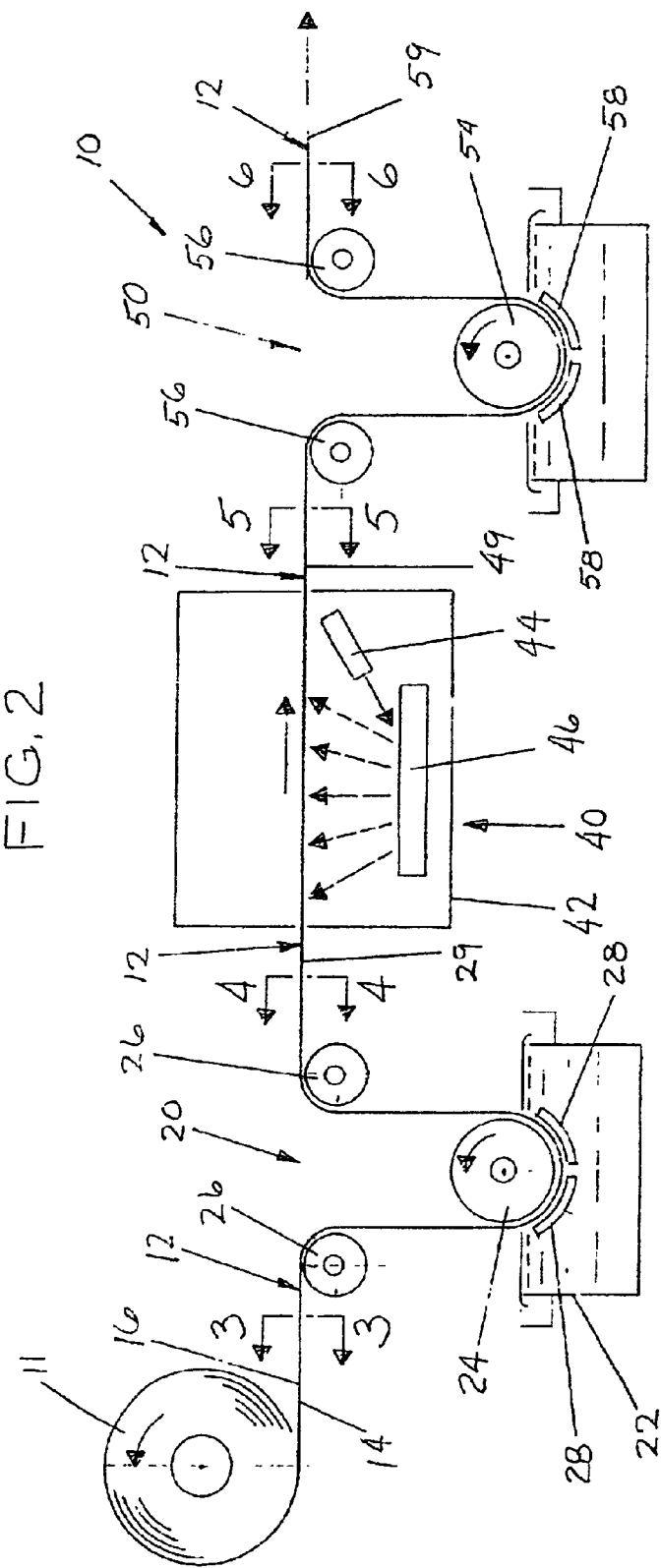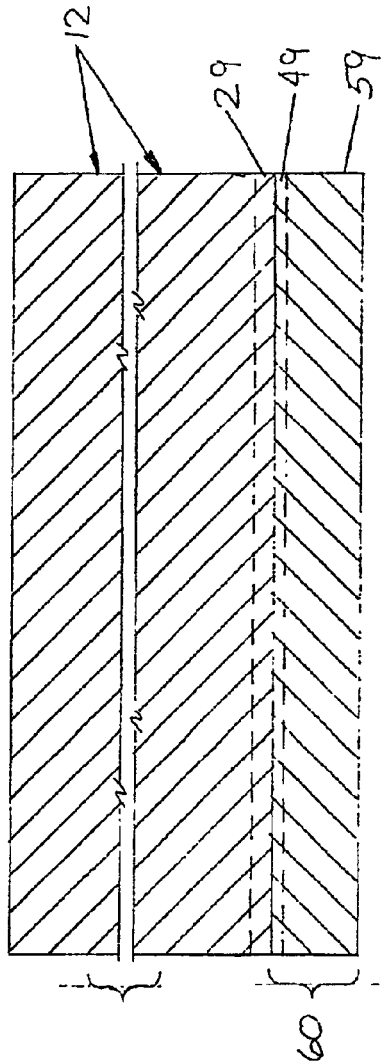
FIG. 1
FIG. 2

PROCESS FOR MANUFACTURING COPPER FOIL ON A METAL CARRIER SUBSTRATE

FIELD OF THE INVENTION

The present invention relates to a process for forming a releasable metal layer on a metal carrier substrate, and more particularly to a process involving both vapor deposition and electrodeposition to form a releasable copper layer on a carrier substrate.

BACKGROUND OF THE INVENTION

In the electronics industry, increased functionality continues to be integrated into smaller, lighter, and less costly electronic devices. The width of the copper trace lines on a printed wiring board (PWB) has a significant influence on the size of the printed wiring board, and the amount of functionality that can be crammed into the allotted space. Accordingly, the electronics industry continually strives for finer lines and spaces to provide smaller, lighter and less expensive electronic devices having greater functionality. The minimum width of the copper trace lines attainable by a subtractive etching process is strongly influenced by the thickness of the copper foil on the surface of the laminate. Thinner copper foil enables the fabrication of narrower trace lines.

Further, in this regard, multi-layer PWBs increasingly use microvia technology to make interconnections between conductive layers. A microvia is generally defined as a via ("electrical path") that is less than 0.1 mm in diameter between two layers of a circuit board structure. The microvias are preferably produced by a laser that "drills" small holes through layers of the PWB. It has been found that copper foil having a thickness less than 5 $\mu$m is more advantageous than thicker copper foils in a laser drilling process, in that lasers currently used in forming microvias more easily drill through thin copper foil than thicker copper foils. Thus, thinner copper foils are more desirous in forming multi-layer printed wiring boards in that they facilitate finer trace lines and are easier to drill using present laser processes.

The present invention relates to a method of forming thin copper foil on a carrier substrate, which copper foil is for use in forming printed wiring boards.

SUMMARY OF THE INVENTION

In accordance with the present invention, there is provided a method for producing a releasable copper foil on a carrier substrate. The method includes the steps of: (a) vapor-depositing a layer of copper onto a carrier substrate having a separation facilitating layer formed thereon, wherein the vapor-deposited layer protects the separation facilitating layer during subsequent processing; and (b) electrodepositing a layer of copper onto the vapor-deposited layer of the metal, thereby increasing the thickness of the copper layer.

According to another aspect of the present invention, there is provided a component for use in forming a printed wiring board, comprising: a carrier substrate; a separation facilitating layer formed on the carrier substrate; a vapor-deposited layer of copper on the separation facilitating layer, wherein the vapor-deposited layer protects the separation facilitating layer; and an electrodeposited layer of copper on the vapor-deposited layer.

It is an object of the present invention to provide a thin copper foil for use in forming a printed wiring board.

It is another object of the present invention to provide a releasable thin copper foil on a carrier substrate having a separation facilitating layer.

It is another object of the present invention to provide a releasable thin copper foil on a carrier substrate having a protective layer of vapor-deposited copper for protecting a separation facilitating layer during subsequent processing.

It is another object of the present invention to provide a thin copper foil on a carrier substrate as described above, that can be easily handled.

Another object of the present invention to provide a thin copper foil that enhances the yield and productivity of a PWB production process.

A still further object of the present invention is to provide a novel process for manufacture of a relatively thin copper foil.

A still further object of the present invention is to provide a process for manufacture of a thin copper foil on a carrier substrate that has reliable releaseability from the carrier.

Yet another object of the present invention is to provide a process as described above for manufacture of a thin copper foil that has a relatively low porosity.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein:

FIG. 1 is a cross-sectional view of a releasable copper foil on a metal carrier substrate, according to the present invention;

FIG. 2 is a schematic view of a process for applying copper onto a surface of a carrier substrate in accordance with a preferred embodiment of the present invention;

DETAILED DESCRIPTION OF PREFERRED EMBODIMENT

Figure 3:
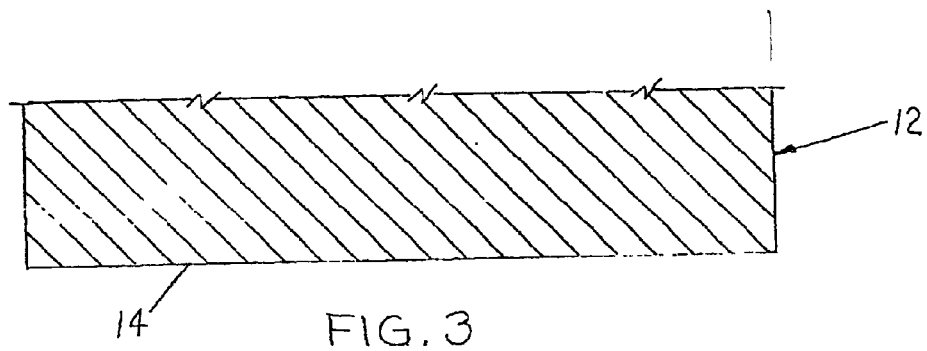
FIG. 3 is an enlarged partial cross-sectional view taken along lines 3—3 of FIG. 2 showing a carrier substrate in the form of a sheet of copper foil.

Referring now to the drawings wherein the showings are for the purpose of illustrating the preferred embodiment of the invention only, and not for the purpose of limiting same, FIG. 1 is a cross-sectional view of a releasable copper foil 60 on a metal carrier substrate 12, according to the present invention. Copper foil 60 is comprised of a vapor-deposited layer 29 and an electrodeposited layer 59, as will be described in further detail below.

It will be appreciated that the present invention is described herein with particular reference to manufacture of a relatively thin copper foil, namely a releasable copper foil of about 0.5 oz/ft² or less. As is known in the prior art, foil of such dimension is not well suited to handling in the absence of a carrier substrate. It is contemplated that the present invention may also find advantageous application in the manufacture of copper foils having a wide range of thicknesses.

Carrier substrate 12 is formed of a material, including but not limited to, copper, aluminum, tin, chromium, nickel, stainless steel, and plated carbon steel. A separation facilitating layer 29 is located between copper foil 60 and carrier substrate 12, to allow carrier substrate 12 to be separable from copper foil 60, as will be explained in detail below.

Separation facilitating layer 29 may be a naturally occurring layer of carrier substrate 12, or may be added to a surface of carrier substrate 12 through additional processing of carrier substrate 12. Most metals naturally form an oxide layer that is suitable as a separation facilitating layer 29, while other metals require additional processing to add a suitable separation facilitating layer 29, as described in detail below.

By way of example and not limitation, separation facilitating layer 29 may be suitably formed of metal oxides and organic materials. Metal oxides suitable as separation facilitating layer 29 naturally occur for some metals, including but not limited to, copper, aluminum, tin, chromium, nickel, and stainless steel. The naturally-occurring oxide layer forms when the metal is exposed to air.

Metals naturally form an oxide layer, but the oxide composition and thickness for some metals (e.g., copper) is highly variable giving rise to separation inconsistency when such oxide layer (e.g., copper oxide) is used as a separation facilitating layer 29. Thus, additional processing to add a suitable separation facilitating layer 29 is preferred for some metals. Such metals include, but are not limited to, copper and steel. For example, in accordance with a preferred embodiment, a carrier substrate 12 formed of copper undergoes a conventional stabilization process to apply a stabilization layer to carrier substrate 12. The stabilization layer functions as separation facilitating layer 29. The stabilization layer is comprised of metal oxide(s) suitable as separation facilitating layer 29. The metal oxide(s) include by way of example and not limitation, zinc oxide and chromium oxide.

In the case of a carrier substrate 12 formed of steel, the carrier substrate 12 may undergo a plating process to add a layer of metal having an oxide layer suitable as separation facilitating layer 29. The plated layer of metal may take the form of, by way of example and not limitation, tin, chromium and nickel (that as indicated above naturally form a suitable oxide layer) and stabilized copper (i.e., copper having undergone a stabilization process to apply a stabilizer layer thereto).

As indicated above, organic materials may also be used as a suitable separation facilitating layer 29. Suitable organics include, but are not limited to, silane, benzotriazole (BTA), and isopropyl alcohol (isopropanol).

It has been recognized that electrodepositing of copper directly onto separation facilitating layer 29 is not possible in that separation facilitating layer 29 formed of metal oxide(s) or organic material(s) will dissolve if immersed into an electrolyte (e.g., an acid plating solution containing copper) or any other plating solution. To prevent dissolution of separation facilitating layer 29 in the acid bath, a very thin layer 49 of copper is deposited onto separation facilitating layer 29 by vapor deposition, as will be described below. An additional layer 59 of copper is electrodeposited onto vapor-deposited copper layer 49 to provide a copper layer 60 of a desired thickness. It should be understood that vapor-deposited copper layer 49 protects separation facilitating layer 29 during the electrodeposition process. Accordingly, separation facilitating layer 29 is preserved so that it can operate to facilitate the separation of carrier substrate 12 from copper layer 60 during use of the present invention, as will be discussed in further detail below.

The present invention will now be described in further detail in connection with a preferred embodiment. In the preferred embodiment, carrier substrate 12 takes the form of a copper foil, and separation facilitating layer 29 takes the form of a stabilization layer.

FIG. 2 is a schematic view of a generally continuous manufacturing process 10 for applying a metal (preferably copper) onto a surface of carrier substrate 12 (preferably copper foil), illustrating a preferred embodiment of the present invention. In the embodiment shown, a roll 11 provides a generally continuous strip of carrier substrate 12. FIG. 3 is an enlarged partial cross-sectional view of carrier substrate 12. Copper foils typically have nominal thicknesses ranging from 0.005 mm (0.0002 inches) to 0.50 mm (0.02 inches). Copper foil thickness is frequently expressed in terms of weight per unit area, and typically the foils of the present invention have weights ranging from ⅛ oz/ft² to 14 oz/ft². Especially useful in forming printed circuit boards are copper foils having weights of ⅛, ⅓, ½, 1 or 2 oz/ft². In accordance with a preferred embodiment, carrier substrate 12 is an electrodeposited copper foil having a weight per unit area of 0.5 oz/ft² to 3 oz/ft², and preferably about 1 oz/ft². Carrier substrate 12 has a shiny side 14 and a matte side 16. It will be appreciated by those skilled in the art that carrier substrate 12 may also be a rolled (wrought) copper foil.

While in a preferred embodiment of the present invention described herein a copper layer is applied to shiny side 14 of carrier substrate 12, it is contemplated that the copper layer may alternatively be applied to matte side 16, or to both shiny side 14 and matte side 16. Moreover, as indicated above, it is also contemplated that metals other than copper may be suitable for use as the carrier substrate.

Carrier substrate 12 first undergoes a process 20, to apply separation facilitating layer 29, that facilitates the separation of a copper layer from carrier substrate 12. In the illustrated embodiment, process 20 is a stabilization process to apply a conventional stabilization layer to carrier substrate 12. Carrier substrate 12 is directed into a tank 22 and around a guide roll 24. Carrier substrate 12 is positioned relative to guide roll 24 by guide rollers 26. Tank 22 contains an electrolytic solution.

In accordance with a preferred embodiment of the present invention, the electrolytic solution contains zinc ions and chromium ions to produce a separation facilitating layer 29 in the form of a stabilization layer containing zinc oxide and chromium oxide. The source of zinc ions for the electrolytic solution can be any zinc salt, examples include $ZnSO_4$, $ZnCO_3$, $ZnCrO_4$, etc. The source of chromium ions for the electrolytic solution can be any hexavalent chromium salt or compound, examples include $ZnCrO_4$, $CrO_3$, etc. The concentration of zinc ions in the electrolytic solution is generally in the range of 0.1 g/l to 2 g/l, preferably 0.3 g/l to 0.6 g/l, and more preferably 0.4 g/l to 0.5 g/l. The concentration of chromium ions in the electrolytic solution is generally in the range of 0.3 g/l to 5 g/l, preferably 0.5 g/l to 3 g/l, and more preferably 0.5 g/l to 1.0 g/l.

In another embodiment, nickel oxide or nickel metal may also be deposited by itself or co-deposited with either zinc oxide or chromium oxide, or both, to form separation facilitating layer 29 in the form of a stabilization layer. The source of nickel ions for the electrolytic solution can be any of the following individually or in combination: $Ni_2SO_4$, $NiCO_3$, etc. The concentration of nickel ions in the electrolytic solution is generally in the range of about 0.2 g/l to about 1.2 g/l.

In yet another embodiment, separation facilitating layer 29 may take the form of a stabilization layer containing phosphorous, as is disclosed in U.S. Pat. No. 5,908,544, and which is expressly incorporated by reference herein.

It should be understood that the electrolytic solution can include other conventional additives such as $Na_2SO_4$ at concentrations in the range of 1 g/l to 50 g/l, preferably 10 g/l to 20 g/l and more preferably 12 g/l to 18 g/l. The pH of the electrolytic solution is generally in the range of 3 to 6, preferably 4 to 5, and more preferably about 4.8 to 5.0.

The temperature of the electrolytic solution is generally in the range of 20° C. to 100° C., preferably 25° C. to 45° C., and more preferably from 26° C. to 44° C.

In accordance with yet a further embodiment of the present invention, separation facilitating layer 29 takes the form of a stabilization layer comprised only of chromium oxide. The bath chemistries and process conditions for applying a layer of chromium oxide are as follows:

1–10 g/l CrO3 solution (Preferred 5 g/l CrO3)

pH-2

Bath temperature: 25° C.

10–30 amps/ft$^2$ for 5–10 seconds or dip treatment: 10 seconds

Figure 4:
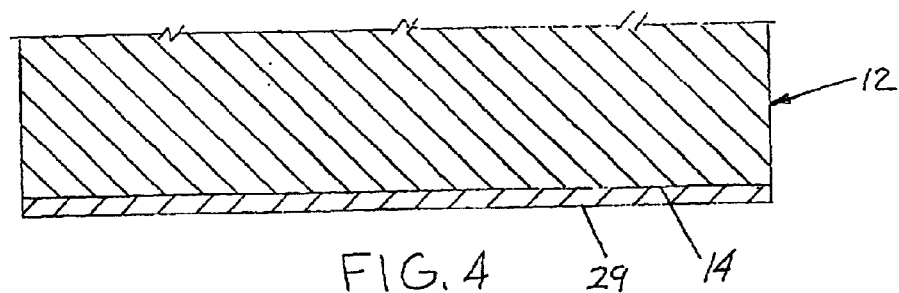
FIG. 4 is an enlarged partial cross-sectional view taken along lines 4—4 of FIG. 2, showing the sheet of copper foil of FIG. 3 with a separation facilitating layer thereon.

As discussed above, in accordance with a preferred embodiment of the present invention, separation facilitating layer 29 is comprised of chromium oxide and zinc oxide by using an electrolytic solution containing zinc and chromium ions. separation facilitating layer 29, having a preferred thickness in the range of 5 Å to 1000 Å, preferably 20 Å to 70 Å, and more preferably 30 Å to 50 Å, is applied to carrier substrate 12. In the embodiment shown in FIG. 2, anodes 28 are disposed adjacent shiny side 14 of carrier substrate 12. A separation facilitating layer 29, in the form of a stabilization layer comprised of zinc oxide and chromium oxide, is deposited on the exposed shiny side 14 of carrier substrate 12 when anodes 28 are energized by a power source (not shown). FIG. 4 is a partial cross-sectional view showing carrier substrate 12 with separation facilitating layer 29 on shiny side 14. As indicated above, shiny side 14 and matte side 16 may be reversed, wherein processing is performed to the opposite side, or alternatively processing may be performed to both shiny and matte sides.

For this preferred embodiment, a current density in the range of 1 amp/ft$^2$ to 100 amps/ft$^2$, preferably 25 amps/ft$^2$ to 50 amps/ft$^2$, and more preferably about 30 amps/ft$^2$, is created along carrier substrate 12. Where multiple anodes are employed, the current density may be varied between the anodes. The plating time that is used is generally in the range of 1 second to 30 seconds, preferably 5 seconds to 20 seconds, and more preferably about 15 seconds. In one embodiment, the total treatment time on the shiny side is from 3 seconds to 10 seconds.

In one embodiment, the mole ratio of zinc ions to chromium ions in the electrolytic solution is in the range of 0.2 to 10, preferably 1 to 5, and more preferably about 1.4.

It should be understood that it is not necessary that the copper foil undergo process 20 for applying a stabilization layer as part of a continuous manufacturing process, as described herein. In this regard, a "pre-stabilized" copper foil may be suitably used.

It has been recognized that electrodeposition of copper directly onto separation facilitating layer 29 is not possible in that separation facilitating layer 29 formed of metal oxide(s) or organic material(s) will dissolve if immersed into an electrolyte (e.g., an acid plating solution containing copper). To prevent dissolution of separation facilitating layer 29 in the acid bath, a very thin layer 49 of copper is deposited onto separation facilitating layer 29 by a deposition process 40. Copper layer 49 is a protective layer to protect separation facilitating layer 29 from being dissolved by the electrolyte.

Deposition process 40 may take the form of a physical vapor deposition (PVD) process, a chemical vapor deposition (CVD) process, or a combination thereof, such as a combustion chemical vapor deposition (CCVD) process. In a preferred embodiment, deposition process 40 is a vacuum deposition process, preferably sputtering, as schematically illustrated in FIG. 2. Vapor-deposited copper layer 49 generally has a thickness in the range of 50 Å to 10,000 Å (1 μm), and preferably in a range of 1,000 Å to 2,000 Å. It has been found that by adjusting the sputtering parameter of the sputter machine, the releasability of the copper sputtered thereon can be controlled to improve the releaseability of the copper that is later built on it.

The desired thickness of vapor-deposited copper layer 49 is sufficient to protect separation facilitating layer 29 during a subsequent electrodeposition process. As discussed above, vapor-deposited copper layer 49 functions to protect separation facilitating layer 29 from dissolving before copper can be deposited thereon during a subsequent electrodeposition process. It is preferable to minimize the amount of vapor-deposited copper needed to meet the foregoing objectives, while maximizing the amount of copper applied by an electrodeposition process, since electrodeposition of copper is less costly than vapor deposition of copper.

Figure 5:
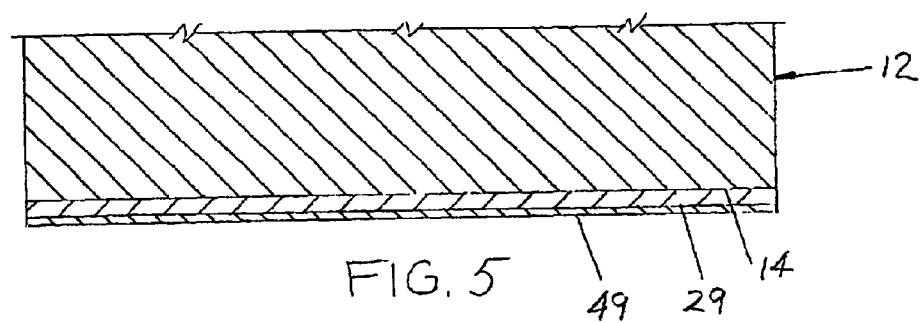
FIG. 5 is an enlarged partial cross-sectional view taken along lines 5—5 of FIG. 2, showing the sheet of copper foil of FIG. 4 with a vapor-deposited copper layer thereon.

As seen in FIG. 2, carrier substrate 12 with separation facilitating layer 29 thereon is conveyed into a deposition chamber designated 42. An electron beam gun 44 directs a stream of electrons at a target 46 comprised of a metal (i.e., copper) such that metallic species are knocked loose and deposited onto a surface of carrier substrate 12. In the embodiment shown, the deposition process applies copper onto the shiny side of carrier substrate 12. In the embodiment shown, a single target 46 is illustrated. As will be appreciated, multiple targets may be used. FIG. 5 is a partial cross-sectional view showing carrier substrate 12 with separation facilitating layer 29 and vapor-deposited copper layer 49 thereon.

It will be appreciated that copper layer 49 can be applied to a separation facilitating layer 29 formed on either the shiny side, matte side, or both shiny and matte sides of carrier substrate 12.

Figure 6:
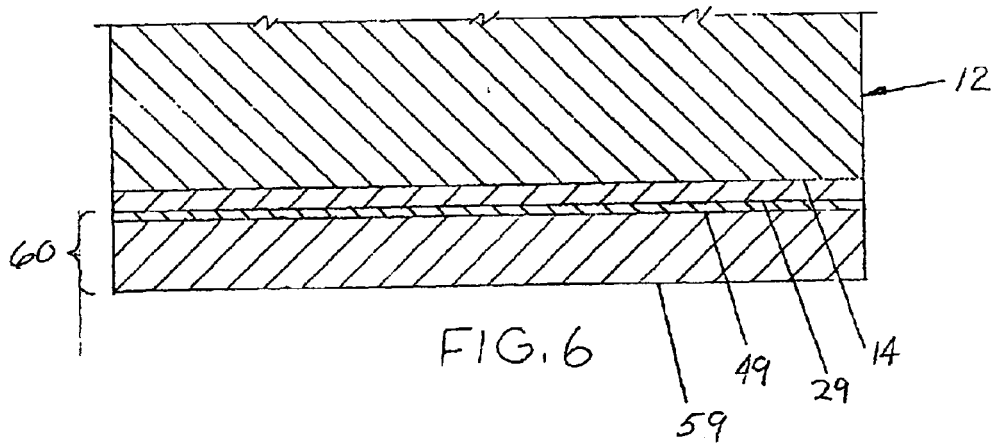
FIG. 6 is an enlarged partial cross-sectional view taken along lines 6—6 of FIG. 2, showing the sheet of copper foil of FIG. 5 with an electrodeposited copper layer thereon.

Following process 20 and vapor deposition process 40, carrier substrate 12 undergoes an electrodeposition process, designated 50. Carrier substrate 12 is directed into a tank 52 and around a guide roll 54. Carrier substrate 12 is positioned relative to guide roll 54 by guide rollers 56. Tank 52 contains an electrolytic solution comprising copper ions. Anodes 58 are disposed adjacent to carrier substrate 12 to apply a current density to carrier substrate 12. An electrodeposited copper layer is deposited onto vapor-deposited copper layer 49 when anodes 58 are energized by a power source (not shown). FIG. 6 is a partial cross-sectional view showing carrier substrate 12 with separation facilitating layer 29, vapor-deposited copper layer 49, and electrodeposited copper layer 59 thereon.

In accordance with a preferred embodiment, the copper is plated onto carrier substrate 12 using any convenient copper-plating electrolyte, such as copper-sulfate plating solution (electrolyte). In a preferred embodiment, a copper-sulfate plating solution contains 50 g/l to 120 g/l $Cu^{+2}$, and preferably about 70 g/l $Cu^{+2}$, and 20 g/l to 80 g/l $H_2SO_4$, and preferably 30 g/l to 40 g/l $H_2SO_4$. The copper-plating electrolyte is preferably free of additives, but may include such additives as chloride, glue, polyethylene oxides, thiourea, and the like. These additives may be used to enhance the qualities and properties of copper electrodeposits. The copper in the electrolyte may be in the form of copper sulfate, copper cyanide, copper phosphate, copper sulfamate, and the like. It should be understood that the electrolyte described above is by way of example and not limitation. In this respect, the composition and concentrations of the electrolyte may vary.

Copper is preferably electrodeposited onto carrier substrate 12 for a sufficient amount of time to form an electrodeposited copper layer 59 having a thickness of 1 μm to 35 μm, preferably 1 μm to 5 μm, and more preferably about 3 μm, on top of the vapor-deposited copper. In a preferred embodiment, copper is electrodeposited at a current density of 100 $amps/ft^2$ to 500 $amps/ft^2$, and more preferably 200 $amps/ft^2$ to 300 $amps/ft^2$.

It is preferable that the plating solution be at a temperature in the range of 110° F. to 150° F., and preferably at 120° F. to 130° F. This relatively low solution temperature results in a lower reaction rate of the electrolyte on the vapor-deposited copper during the electrodeposition process. In this regard, it has been recognized that a low plating bath temperature reduces the acid etching of the vapor-deposited copper layer. Relatively high current density and low plating temperature increase the interface stress between the copper layer and carrier substrate, and improves the releaseability.

It should be appreciated that after the copper electrodeposition process, carrier substrate 12 may optionally undergo further conventionally-known treatments, including but not limited to, adhesion promoting treatments, thermal barrier layer treatments, stain proofing treatments, and resin resistant coating treatments. The adhesion promoting treatments may include, by way of example and not limitation, a nodular treatment to add nodules to the surface of the electrodeposited copper, thus increasing the surface area for bonding to laminate resins, and surface roughening treatments. Another adhesion promoter includes, but is not limited to, silane. The thermal barrier layers include, but are not limited to brass, zinc, indium, or the like. The stain proofing treatments include, but are not limited to zinc and/or chromate. A resin resistant coating may also be applied to thin plated copper surfaces.

Furthermore, it should be appreciated that in addition to the steps illustrated in FIG. 2, cleaning (e.g., to remove oxide film) and drying processes may also be included, as is well known to those skilled in the art. For, instance, following process 20, carrier substrate 12, with separation facilitating layer 29, may undergo a rinse process, wherein water is sprayed onto the surfaces of carrier substrate 12 to rinse and clean the same and to remove any residual electrolytic solution therefrom. Thereafter, carrier substrate 12 may undergo a drying process, wherein forced air dryers 62 are disposed above and below carrier substrate 12 to direct air onto carrier substrate 12 to dry the surface thereof.

The resultant product from vapor deposition process 40 and electrodeposition process 50 is a copper layer 60, comprised of a vapor-deposited copper layer portion (layer 49) and an electrodeposited copper layer portion (layer 59). In general, the vapor-deposited copper layer portion (layer 49) is virtual indistinguishable from the electrodeposited copper layer portion (layer 59). Copper layer 60 is separable from carrier substrate 12 at separation facilitating layer 29. In this regard, separation facilitating layer 29 is split between copper layer 60 and carrier substrate 12. Accordingly, after separation, separation facilitating layer 29 will be found on copper layer 60 and carrier substrate 12.

In use, a laminate component comprised of a carrier substrate 12 with stabilizer layer 29, a vapor-deposited copper layer 49, and an electrodeposited copper layer 59, undergoes a laminating process wherein the copper layer 60 is placed upon a dielectric and is bonded thereto, as is well known to those skilled in the art. The dielectric layer typically takes the form of a partially cured epoxy resin containing woven glass fibers (such a dielectric layer is conventionally referred to as a "prepreg"). The copper foil/dielectric composite is subjected to heat and pressure sufficient to cure the prepreg and form the composite into a laminate. The release strength between copper layer 60 and carrier substrate 12 is preferably less than 0.2 lb/in after lamination. Once the copper layer 60 is secured to the dielectric, carrier substrate 12 may be peeled away from copper layer 60, with carrier substrate 12 separating at separation facilitating layer 29. As indicated above, separation facilitating layer 29 will be divided between carrier substrate 12 and copper layer 60. It should be understood that vapor deposition onto the matte side of the carrier substrate imparts a dull, matte, or satin finish to the exposed side of the circuit foil after carrier removal.

Other modifications and alterations will occur to others upon their reading and understanding of the specification. It is intended that all such modifications and alterations be included insofar as they come within the scope of the invention as claimed or the equivalents thereof.

Having described the invention, the following is claimed:

1. A component for use in forming a printed wiring board, comprising:
   a metal carrier substrate;
   a separation facilitating layer formed on the metal carrier substrate;
   a vapor-deposited layer of copper on the separation facilitating layer, wherein the vapor-deposited layer has a thickness in a range of 50 Å to 10,000 Å to protect the separation facilitating layer; and
   an electrodeposited layer of copper having a thickness in a range of 1 μm to 35 μm on the vapor-deposited layer of copper.

2. A component according to claim 1, wherein said separation facilitating layer includes at least one metal oxide.

3. A component according to claim 2, wherein said metal oxide is selected from the group consisting of: aluminum oxide, tin oxide, chromium oxide, nickel oxide, copper oxide, an oxide of stainless steel and zinc oxide.

4. A component according to claim 1, wherein said separation facilitating layer includes at least one organic material.

5. A component according to claim 4, wherein said separation facilitating layer includes at least one organic material selected from the group consisting of: silane, benzotriazole (BTA), and isopropyl alcohol.

6. A component according to claim 1, wherein said separation facilitating layer has a thickness in a range of 5 Å to 1,000 Å.

7. A component according to claim 1, wherein said metal carrier substrate is comprised of copper.

8. A component according to claim 7, wherein said separation facilitating layer is a stabilization layer.

9. A component according to claim 8, wherein said stabilization layer includes chromium oxide and zinc oxide.

10. A component according to claim 1, wherein said metal carrier substrate is selected from the group consisting of: aluminum, tin, copper, chromium, nickel, stainless steel and plated carbon steel.

11. A component according to claim 10, wherein said separation facilitating layer is a comprised of a natural occurring oxide of at least one metal comprising said carrier substrate.

12. A component according to claim 1, wherein said separation facilitating layer is a stabilization layer.

13. A component according to claim 1, wherein said vapor-deposited layer of copper is formed by one of physical vapor deposition, chemical vapor deposition and a combination thereof.

14. A component according to claim 1, wherein said vapor-deposited layer of copper is formed by sputtering.

15. A component according to claim 1, wherein said carrier substrate has a weight per unit area in a range of 0.5 oz/ft$^2$ to 3 oz/ft$^2$.

16. A component according to claim 1, wherein said vapor-deposited layer of copper is formed by a combustion chemical vapor deposition process.

17. A component for use in forming a printed wiring board, comprising:
a copper substrate;
an inorganic separation facilitating layer formed on the copper substrate;
a vapor-deposited layer of copper on the separation facilitating layer, wherein the vapor-deposited layer protects the separation facilitating layer; and
an electrodeposited layer of copper on the vapor-deposited layer.

18. A component according to claim 17, wherein said inorganic separation facilitating layer includes at least one metal oxide.

19. A component according to claim 18, wherein said metal oxide is selected from the group consisting of: tin oxide, chromium oxide, nickel oxide, copper oxide, an oxide of stainless steel and zinc oxide.

20. A component according to claim 19, wherein said inorganic separation facilitating layer has a thickness in a range of 5 Å to 1,000 Å.

21. A component according to claim 20, wherein said stabilization layer includes chromium oxide and zinc oxide.

22. A component according to claim 19, wherein said electrodeposited layer of copper has a thickness in a range of 1 μm to 35 μm.

23. A component according to claim 19, wherein said carrier substrate has a weight per unit area in a range of 0.5 oz/ft$^2$ to 3 oz/ft$^2$.

24. A component for use in forming a printed wiring board, comprising:
a metal carrier substrate;
a separation facilitating layer formed of a metallic oxide on the metal carrier substrate, said separation facilitating layer having a thickness in a range of 5 Å to 1,000 Å;
a vapor-deposited layer of copper on the separation facilitating layer, wherein the vapor-deposited layer protects the separation facilitating layer; and
an electrodeposited layer of copper on the vapor-deposited layer.

25. A component according to claim 24, wherein said metal oxide is selected from the group consisting of: tin oxide, chromium oxide, nickel oxide, copper oxide, an oxide of stainless steel and zinc oxide.

26. A component according to claim 25, wherein said carrier substrate is comprised of copper.

27. A component according to claim 26, wherein said stabilization layer includes chromium oxide and zinc oxide.

28. A component according to claim 26, wherein said electrodeposited layer of copper has a thickness in a range of 1 μm to 35 μm.

29. A component according to claim 26, wherein said carrier substrate has a weight per unit area in a range of 0.5 oz/ft$^2$ to 3 oz/ft$^2$.

* * * * *